(12) United States Patent
Das et al.

(10) Patent No.: US 7,384,856 B2
(45) Date of Patent: Jun. 10, 2008

(54) METHOD OF MAKING AN INTERNAL CAPACITIVE SUBSTRATE FOR USE IN A CIRCUITIZED SUBSTRATE AND METHOD OF MAKING SAID CIRCUITIZED SUBSTRATE

(75) Inventors: Rabindra N. Das, Ithaca, NY (US); John M. Lauffer, Waverly, NY (US); Voya R. Markovich, Endwell, NY (US); James T. Matthews, Binghamton, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 395 days.

(21) Appl. No.: 11/172,794

(22) Filed: Jul. 5, 2005

(65) Prior Publication Data

US 2006/0154434 A1   Jul. 13, 2006

Related U.S. Application Data

(63) Continuation-in-part of application No. 11/031,085, filed on Jan. 10, 2005.

(51) Int. Cl.
*H01L 21/20* (2006.01)
(52) U.S. Cl. ..................................... 438/396
(58) Field of Classification Search ................. 438/396
See application file for complete search history.

(56) References Cited

U.S. PATENT DOCUMENTS

| | | | |
|---|---|---|---|
| 5,016,085 A | 5/1991 | Hubbard et al. | |
| 5,026,624 A | 6/1991 | Day et al. | |
| 5,079,069 A | 1/1992 | Howard et al. | |
| 5,099,309 A | 3/1992 | Kryzaniwsky | |
| 5,162,977 A | 11/1992 | Paurus et al. | |
| 5,280,192 A | 1/1994 | Kryzaniwsky | |
| 5,300,402 A | 4/1994 | Card, Jr. et al. | |
| 5,426,263 A | 6/1995 | Potter et al. | |
| 5,745,333 A * | 4/1998 | Frankeny et al. | 361/313 |
| 5,745,334 A * | 4/1998 | Hoffarth et al. | 361/313 |
| 5,831,833 A | 11/1998 | Shirakawa et al. | |
| 6,068,782 A | 5/2000 | Brandt et al. | |
| 6,084,306 A | 7/2000 | Yew et al. | |
| 6,150,456 A | 11/2000 | Lee et al. | |
| 6,207,595 B1 | 3/2001 | Appelt et al. | |
| 6,242,282 B1 | 6/2001 | Fillion et al. | |
| 6,370,012 B1 | 4/2002 | Adae-Amoakoh et al. | |
| 6,370,013 B1 * | 4/2002 | Iino et al. | 361/306.3 |
| 6,395,996 B1 | 5/2002 | Tsai et al. | |
| 6,446,317 B1 | 9/2002 | Figueroa et al. | |
| 6,524,352 B2 | 2/2003 | Adae-Amoakoh et al. | |
| 6,544,651 B2 * | 4/2003 | Wong et al. | 428/413 |
| 6,616,794 B2 | 9/2003 | Hartman et al. | |
| 6,704,207 B2 | 3/2004 | Kopf | |

* cited by examiner

*Primary Examiner*—Thao X. Le
*Assistant Examiner*—Ajay K Arora
(74) *Attorney, Agent, or Firm*—Hinman, Howard & Kattell LLP; Lawrence R. Fraley; Mark Levy

(57) ABSTRACT

A method of forming a capacitive substrate in which first and second conductors are formed opposite a dielectric, with one of these electrically coupled to a thru-hole connection. Each functions as an electrode for the resulting capacitor. The substrate is then adapted for being incorporated within a larger structure to form a circuitized substrate such as a printed circuit board or a chip carrier. Additional capacitors are also possible.

19 Claims, 4 Drawing Sheets

METHOD OF MAKING AN INTERNAL CAPACITIVE SUBSTRATE FOR USE IN A CIRCUITIZED SUBSTRATE AND METHOD OF MAKING SAID CIRCUITIZED SUBSTRATE

The present application is a continuation-in-part application of Ser. No. 11/031,085 filed Jan. 10, 2005.

TECHNICAL FIELD

The present invention relates to providing capacitors within circuitized substrates such as printed circuit boards, chip carriers and the like, and more specifically to a method for doing so and to products including such internal components as part thereof.

CROSS REFERENCE TO CO-PENDING APPLICATIONS

In Ser. No. 10/900,385, entitled "Circuitized Substrate With Internal Organic Memory Device, Method Of Making Same, Electrical Assembly Utilizing Same, and Information Handling System Utilizing Same" and filed Jul. 28, 2004 (inventors: S. Desai et al), there is defined a circuitized substrate comprised of at least one layer of dielectric material having an electrically conductive pattern thereon. At least part of the pattern is used as the first layer of an organic memory device which further includes at least a second dielectric layer over the pattern and a second pattern aligned with respect to the lower part for achieving several points of contact to thus form the device. The substrate is preferably combined with other dielectric-circuit layered assemblies to form a multilayered substrate on which can be positioned discrete electronic components (e.g., a logic chip) coupled to the internal memory device to work in combination therewith. An electrical assembly capable of using the substrate is also provided, as is an information handling system adapted for using one or more such electrical assemblies as part thereof. This application is assigned to the same assignee of the present invention. Ser. No. 10/900,385 is now U.S. Pat. 7,253,502, having issued Aug. 7, 2007.

In Ser. No. 10/900,386, entitled "Electrical Assembly With Internal Memory, Circuitized Substrate Having Electrical Components Positioned Thereon, Method Of Making Same, And Information Handling System Utilizing Same" and filed Jul. 28, 2004 (inventors: F. Egitto et al), there is defined an electrical assembly which includes a circuitized substrate comprised of an organic dielectric material having a first electrically conductive pattern thereon. At least part of the dielectric layer and pattern form the first, base portion of an organic memory device, the remaining portion being a second, polymer layer formed over the part of the pattern and a second conductive circuit formed on the polymer layer. A second dielectric layer if formed over the second conductive circuit and first circuit pattern to enclose the organic memory device. The device is electrically coupled to a first electrical component through the second dielectric layer and this first electrical component is electrically coupled to a second electrical component. A method of making the electrical assembly is also provided, as is an information handling system adapted for using one or more such electrical assemblies as part thereof. This application is also assigned to the same assignee as the present invention. Ser. No. 10/900,386 is now U.S. Pat. 7,045,897, having issued May 16, 2006.

In Ser. No. 11/031,085, entitled "Capacitor Material For Use In Circuitized Substrates, Circuitized Substrate Utilizing Same, Method of Making Said Circuitized Substrate, and Information Handling System Utilizing Said Circuitized Substrate" and filed Jan. 10, 2005, there is defined a material for use as part of an internal capacitor within a circuitized substrate wherein the material includes a polymer (e.g., a cycloaliphatic epoxy or phenoxy based) resin and a quantity of nano-powders of ferroelectric ceramic material (e.g., barium titanate) having a particle size substantially in the range of from about 0.01 microns to about 0.90 microns and a surface area for selected ones of these particles within the range of from about 2.0 to about 20 square meters per gram. A circuitized substrate adapted for using such a material and capacitor therein and a method of making such a substrate are also defined. An electrical assembly (substrate and at least one electrical component) and an information handling system (e.g., personal computer) are also defined.

In Ser. No. 11/031,074, entitled "Capacitor Material With Metal Component For Use In Circuitized Substrates, Circuitized Substrate Utilizing Same, Method of Making Said Circuitized Substrate, and Information Handling System Utilizing Said Circuitized Substrate" and filed Jan. 10, 2005, there is defined a material for use as part of an internal capacitor within a circuitized substrate in which the material includes a polymer resin and a quantity of nano-powders including a mixture of at least one metal component and at least one ferroelectric ceramic component, the ferroelectric ceramic component nano-particles having a particle size substantially in the range of between about 0.01 microns and about 0.9 microns and a surface within the range of from about 2.0 to about 20 square meters per gram. A circuitized substrate adapted for using such a material and capacitor therein and a method of making such a substrate are also defined. An electrical assembly (substrate and at least one electrical component) and an information handling system (e.g., personal computer) are also defined. Ser. No. 11/031, 074 is now U.S. Pat. 7,025,607, having issued Apr. 11, 2006.

BACKGROUND OF THE INVENTION

Circuitized substrates such as printed circuit boards (hereinafter also referred to as PCBs), chip carriers, and the like typically are constructed in laminate form in which several layers of dielectric material and conductive material (laminates) are bonded together using relatively high temperature and pressure lamination processes. The conductive layers, typically of thin copper, are usually used in the formed substrate for providing electrical connections to and among various devices located on the surface of the substrate, examples of such devices being integrated circuits (semiconductor chips) and discrete passive devices, such as capacitors, resistors, inductors, and the like. The discrete passive devices occupy a high percentage of the surface area of the completed substrate, which is undesirable from a future design aspect because of the increased need and demand for miniaturization in today's substrates and products containing same art. In order to increase the available substrate surface area (also often referred to as "real estate"), there have been a variety of efforts to include multiple functions (e.g. resistors, capacitors and the like) on a single component for mounting on a board. When passive devices are in such a configuration, these are often referred to collectively and individually as integral passive devices or the like, meaning that the functions are integrated into the singular component. Because of such external positioning, these components still utilize, albeit less than if in singular form, board real estate. In response, there have also been efforts to embed discrete passive components within the board, such components often also referred to as embedded passive components. A capacitor designed for disposition within (between selected layers of) a PCB (board) substrate may thus be referred to as an embedded integral passive component, or, more simply, an embedded capacitor. Such a capacitor thus provides internal capacitance. The result of this internal positioning is that it is unnecessary to also position such devices externally on the PCB's outer surface(s), thus saving valuable PCB real estate.

For a fixed capacitor area, two known approaches are available for increasing the planar capacitance (capacitance/area) of an internal capacitor. In one such approach, higher dielectric constant materials can be used, while in a second, the thickness of the dielectric can be reduced. These constraints are reflected in the following formula, known in the art, for capacitance per area:

$$C/A = (\text{Dielectric Constant of Laminate} \times \text{Dielectric Constant in Vacuum} / \text{Dielectric Thickness})$$

where: C is the capacitance and A is the capacitor's area. Some of the patents listed below, particularly U.S. Pat. No. 5,162,977, mention use of various materials for providing desired capacitance levels under this formula, and many mention or suggest problems associated with the methods and resulting materials used to do so.

As stated, there have been past attempts to provide internal capacitance and other internal conductive structures, components or devices (one good example being internal semiconductor chips) within circuitized substrates (PCBs), some of these including the use of nano-powders (as also defined in Ser. No. 11,031,085 cited above). The following are some examples of such attempts, including those using nano-powders and those using alternative measures.

In U.S. Pat. No. 6,704,207, entitled "Device and Method for Interstitial Components in a Printed Circuit Board", issued Mar. 9, 2004, there is described a printed circuit board (PCB) which includes a first layer having first and second surfaces, with an above-board device (e.g., an ASIC chip) mounted thereon. The PCB includes a second layer having third and fourth surfaces. One of the surfaces can include a recessed portion for securely holding an interstitial component. A "via", electrically connecting the PCB layers, is also coupled to a lead of the interstitial component. The described interstitial components include components such as diodes, transistors, resistors, capacitors, thermocouples, and the like. In what appears to be the preferred embodiment, the interstitial component is a resistor having a similar size to a "0402" resistor (manufactured by Rohm Co.), which has a thickness of about 0.014 inches.

In U.S. Pat. No. 6,616,794, entitled "Integral Capacitance For Printed Circuit Board Using Dielectric Nanopowders" and issued Sep. 9, 2003, there is described a method for producing integral capacitance components for inclusion within printed circuit boards in which hydro-thermally prepared nano-powders permit the fabrication of dielectric layers that offer increased dielectric constants and are readily penetrated by micro-vias. In the method described in this patent, a slurry or suspension of a hydro-thermally prepared nano-powder and solvent is prepared. A suitable bonding material, such as a polymer, is mixed with the nano-powder slurry, to generate a composite mixture which is formed into a dielectric layer. The dielectric layer may be placed upon a conductive layer prior to curing, or conductive layers may be applied upon a cured dielectric layer, either by lamination or metallization processes, such as vapor deposition or sputtering.

In U.S. Pat. No. 6,544,651, entitled "High Dielectric Constant Nano-Structure Polymer-Ceramic Composite" and issued Apr. 3, 2003, there is described a polymer-ceramic composite having high dielectric constants formed using polymers containing a metal acetylacetonate (acacs) curing catalyst. In particular, a certain percentage of Co(III) may increase the dielectric constant of a certain epoxy. The high dielectric polymers are combined with fillers, preferably ceramic fillers, to form two phase composites having high dielectric constants. Composites having about 30 to about 90% volume ceramic loading and a high dielectric base polymer, preferably epoxy, were apparently found to have dielectric constants greater than about 60. Composites having dielectric constants greater than about 74 to about 150 are also mentioned in this patent. Also mentioned are embedded capacitors with capacitance densities of at least 25 nF/cm.sup.2, preferably at least 35 nF/cm.sup.2, most preferably 50 nF/cm.sup.2.

In U.S. Pat. No. 6,524,352, entitled "Method Of Making A Parallel Capacitor Laminate" and issued Feb. 25, 2003, there is defined a parallel capacitor structure capable of forming an internal part of a larger circuit board or the like structure to provide capacitance therefore. Alternatively, the capacitor may be used as an interconnector to interconnect two different electronic components (e.g., chip carriers, circuit boards, and semiconductor chips) while still providing desired levels of capacitance for one or more of said components. The capacitor includes at least one internal conductive layer, two additional conductor layers added on opposite sides of the internal conductor, and inorganic dielectric material (preferably an oxide layer on the second conductor layer's outer surfaces or a suitable dielectric material such as barium titanate applied to the second conductor layers). Further, the capacitor includes outer conductor layers atop the inorganic dielectric material, thus forming a parallel capacitor between the internal and added conductive layers and the outer conductors.

In U.S. Pat. No. 6,446,317, entitled "Hybrid Capacitor And Method Of Fabrication Therefor", and issued Sep. 10, 2002, there is described a hybrid capacitor associated with an integrated circuit package that provides multiple levels of excess, off-chip capacitance to die loads. The hybrid capacitor includes a low inductance, parallel plate capacitor which is embedded within the package and electrically connected to a second source of off-chip capacitance. The parallel plate capacitor is disposed underneath a die, and includes a top conductive layer, a bottom conductive layer, and a thin dielectric layer that electrically isolates the top and bottom layers. The second source of off-chip capacitance is a set of self-aligned via capacitors, and/or one or more discrete capacitors, and/or an additional parallel plate capacitor. Each of the self-aligned via capacitors is embedded within the package, and has an inner conductor and an outer conductor. The inner conductor is electrically connected to either the top or bottom conductive layer, and the outer conductor is electrically connected to the other conductive layer. The discrete capacitors are electrically connected to contacts from the conductive layers to the surface of the package. During operation, one of the conductive layers of the low inductance parallel plate capacitor provides a ground plane, while the other conductive layer provides a power plane.

In U.S. Pat. No. 6,395,996, entitled "Multi-layered Substrate With Built-In Capacitor Design" and issued May 28, 2002, there is described a multi-layered substrate having built-in capacitors which are used to decouple high frequency noise generated by voltage fluctuations between a power plane and a ground plane of a multi-layered substrate. At least one kind of dielectric material, which has filled-in through holes between the power plane and the ground plane and includes a high dielectric constant, is used to form the built-in capacitors.

In U.S. Pat. No. 6,370,012, entitled "Capacitor Laminate For Use In A Printed Circuit Board And As An Interconnector" and issued Apr. 9, 2002, there is described a parallel capacitor structure capable of forming an internal part of a larger circuit board or the like structure to provide capacitance there-for. Alternatively, the capacitor may be used as an inter-connector to interconnect two different electronic components (e.g., chip carriers, circuit boards, and even semiconductor chips) while still providing desired levels of capacitance for one or more of said components. The capacitor includes at least one internal conductive layer, two additional conductor layers added on opposite sides of the internal conductor, and inorganic dielectric material (preferably an oxide layer on the second conductor layer's outer surfaces or a suitable dielectric material such as barium titanate applied to the second conductor layers). Further, the capacitor includes outer conductor layers atop the inorganic dielectric material, thus forming a parallel capacitor between the internal and added conductive layers and the outer conductors.

In U.S. Pat. No. 6,242,282, entitled "Circuit Chip Package and Fabrication Method", issued Jun. 5, 2001, there is described a method for packaging a chip which includes the steps of providing an interconnect layer including insulative material having a first side and a second side, initial metallization patterned on second side metallized portions of the second side and not on second side non-metallized portions of the second side, a substrate via extending from the first side to one of the second side metallized portions, and a chip via extending from the first side to the second side non-metallized portion. The method also includes positioning a chip on the second side with a chip pad of the chip being aligned with the chip via, and patterning connection metallization on selected portions of the first side of the interconnect layer and in the via so as to extend to the second side metallized portion and to the chip pad. About the chip is molded a "substrate" or other dielectric material.

In U.S. Pat. No. 6,207,595, entitled "Laminate and Method of Manufacture Thereof", issued Mar. 27, 2001, there is described a fabric-resin dielectric material for use in a laminate structure and method of its manufacture. The resulting structure is adaptable for use in a printed circuit board or chip carrier substrate. The resin may be an epoxy resin such as is currently used on a large scale worldwide for "FR-4" composites. A resin material based on bismaleimide-triazine (BT) is also acceptable, this patent further adding that, more preferably, the resin is a phenolically hardenable resin material as is known in the art, with a glass transition temperature of about 145 degrees Celsius (C.).

In U.S. Pat. No. 6,150,456, entitled "High Dielectric Constant Flexible Polyimide Film And Process Of Preparations, issued Nov. 21, 2000, there is described a flexible, high dielectric constant polyimide film composed of either a single layer of an adhesive thermoplastic polyimide film or a multilayer polyimide film having adhesive thermoplastic polyimide film layers bonded to one or both sides of the film and having dispersed in at least one of the polyimide layers from 4 to 85 weight % of a ferroelectric ceramic filler, such as barium titanate or polyimide-coated barium titanate, and having a dielectric constant of from 4 to 60. The high dielectric constant polyimide film can be used in electronic circuitry and electronic components such as multilayer printed circuits, flexible circuits, semiconductor packaging and buried (internal) film capacitors.

In U.S. Pat. No. 6,084,306, entitled "Bridging Method of Interconnects for Integrated Circuit Packages", issued Jul. 4, 2000, there is described an integrated circuit package having first and second layers, a plurality of routing pads being integral with the first layer, a plurality of upper and lower conduits, respectively, disposed on the upper and lower surfaces of the first layer, one of the upper conduits electrically connected to one of the lower conduits, a plurality of pads disposed on the second layer, vias that electrically connect the pads to the lower conduits and a chip adhered to the second layer having bonding pads, at least one of which is electrically connected to one of the routing pads.

In U.S. Pat. No. 6,068,782, entitled "Individual Embedded Capacitors For Laminated Printed Circuit Boards" and issued May 30, 2000, there is described a method of fabricating individual, embedded capacitors in multilayer printed circuit boards. The method is allegedly compatible of being performed using standard printed circuit board fabrication techniques. The capacitor fabrication is based on a sequential build-up technology employing a first pattern-able insulator. After patterning of the insulator, pattern grooves are filled with a high dielectric constant material, typically a polymer/ceramic composite. Capacitance values are defined by the pattern size, thickness and dielectric constant of the composite. Capacitor electrodes and other electrical circuitry can be created either by etching laminated copper, by metal evaporation or by depositing conductive ink.

In U.S. Pat. No. 5,831,833, entitled "Bare Chip Mounting Printed Circuit Board and a Method of Manufacturing Thereof by Photo-etching", issued Nov. 3, 1998, there is described a method of manufacturing a "bare chip" multilayer printed circuit board in which arbitrary numbers of wiring circuit conductor layers and insulating layers are alternately stacked on one or both surfaces of a printed circuit board as a substrate, and a recessed portion with an upper opening capable of mounting and resin-encapsulating a bare chip part is formed on the surface of the printed circuit board. In what appears to be the preferred embodiment, one of the insulating layers is made from a photosensitive resin, and the bare chip part mounting recessed portion is formed by photo-etching the insulating layer made from the photo-sensitive resin.

In U.S. Pat. No. 5,426,263, entitled "Electronic Assembly Having a Double-sided Leadless Component", issued Jun. 20, 1995, there is described an electronic assembly which has a double-sided leadless component and two printed circuit boards. The component has a plurality of electrical terminations or pads on both opposing major surfaces. Each of the printed circuit boards has a printed circuit pattern that has a plurality of pads that correspond to the electrical terminations on both sides of the double-sided leadless component. The electrical terminals on one side of the component are attached to the pads on the first board and the electrical terminals on the other side of the leadless component are attached to the pads on the second board. The printed circuit boards are joined together to form a multi-layered circuit board so that the double-sided leadless component is buried or recessed inside. The component is attached to the pads of the printed circuit board using solder.

In U.S. Pat. No. 5,280,192, entitled "Three-dimensional Memory Card Structure With Internal Direct Chip Attachment", issued Jan. 18, 1994, there is described a card structure which includes an internal three dimensional array of implanted semiconductor chips. The card structure includes a power core and a plurality of chip cores. Each chip core is joined to the power core on opposite surfaces of the power core, and each chip core includes a compensator core having a two dimensional array of chip wells. Each chip well allows for a respective one of the semiconductor chips to be implanted therein. Further, a compliant dielectric material is disposed on the major surfaces of the compensator core except at the bottoms of the chip wells. The compliant dielectric material has a low dielectric constant and has a thermal coefficient of expansion compatible with those of the semiconductor chips and the compensator core, so that thermal expansion stability with the chips and the compensator core is maintained.

In U.S. Pat. No. 5,162,977, entitled "Printed Circuit Board Having An Integrated Decoupling Capacitive Element" and issued Nov. 10, 1992, there is described a PCB which includes a high capacitance power distribution core, the manufacture of which is compatible with standard printed circuit board assembly technology. The high capacitance core consists of a ground plane and a power plane separated by a planar element having a high dielectric constant. The high dielectric constant material is typically glass fiber impregnated with a bonding material, such as epoxy resin loaded with a ferro-electric ceramic substance having a high dielectric constant. The ferro-electric ceramic substance is typically a nano-powder combined with an epoxy bonding material. According to this patent, the resulting capacitance of the power distribution core is sufficient to totally eliminate the need for decoupling capacitors on a PCB. Use of pre-fired and ground ceramic nano-powders in the dielectric layer poses obstacles for the formation of thru-holes (conductive holes permitting electronic communication between conductive layers of a PCB), however. Pre-fired and ground ceramic nano-powder particles have a typical dimension in the range of 500-20,000 nanometers (nm). Furthermore, the particle distribution in this range is generally rather broad, meaning that there could be a 10,000 nm particle alongside a 500 nm particle. The distribution within the dielectric layer of particles of different size often presents major obstacles to thru-hole formation where the thru-holes are of extremely small diameter, also referred to in the industry as micro-vias due to the presence of the larger particles. Another problem associated with pre-fired ceramic nano-powders is the ability for the dielectric layer to withstand substantial voltage without breakdown occurring across the layer. Typically, capacitance layers within a PCB are expected to withstand at least 300 volts (V) in order to qualify as a reliable component for PCB construction. The presence of the comparatively larger ceramic particles in pre-fired ceramic nano-powders within a capacitance layer prevents extremely thin layers from being used because the boundaries of contiguous large particles provide a path for voltage breakdown. This is even further undesirable because, as indicated by the equation cited above, greater planar capacitance may also be achieved by reducing the thickness of the dielectric layer. The thickness is thus limited by the size of the particles therein.

In U.S. Pat. No. 5,099,309, entitled "Three-dimensional Memory Card Structure With Internal Direct Chip Attachment", issued Mar. 24, 1992, there is described a memory card structure containing an embedded three dimensional array of semiconductor memory chips. The card structure includes at least one memory core and at least one power core which are joined together in an overlapping relationship. Each memory core comprises a copper-invar-copper (CIC) thermal conductor plane having a two dimensional array of chip well locations on each side of the plane. Polytetrafluoroethylene (PTFE) covers the major surfaces of the thermal conductor plane except at the bottoms of the chip wells. Memory chips are placed in the chip wells and are covered by insulating and wiring levels. Each power core comprises at least one CIC electrical conductor plane and PTFE covering the major surfaces of the electrical conductor plane. Provision is made for providing electrical connection pathways and cooling pathways along vertical as well as horizontal planes internal to the card structure.

In U.S. Pat. No. 5,079,069, entitled "Capacitor Laminate For Use In Capacitive Printed Circuit Boards And Methods Of Manufacture" and issued Jan. 7, 1992, there is described a capacitor laminate which allegedly serves to provide a bypass capacitive function for devices mounted on the PCB, the capacitor laminate being formed of conventional conductive and dielectric layers whereby each individual external device is allegedly provided with capacitance by a proportional portion of the capacitor laminate and by borrowed capacitance from other portions of the capacitor laminate, the capacitive function of the capacitor laminate being dependent upon random firing or operation of the devices. That is, the resulting PCB still requires the utilization of external devices thereon, and thus does not afford the PCB external surface area real estate savings mentioned above which are desired and demanded in today's technology.

In U.S. Pat. No. 5,016,085, entitled "Hermetic package for integrated circuit chips, issued May 14, 1991, there is described a hermetic package which has an interior recess for holding a semiconductor chip. The recess is square and set at 45 degrees with respect to the rectangular exterior of the package. The package uses ceramic layers which make up the package's conductive planes with the interior opening stepped to provide connection points. The lowest layer having a chip opening therein may be left out of the assembly to provide a shallower chip opening recess. This of course is not the same as an internally formed capacitance or semiconductor component of the nature described above, but it does mention internal ceramic layers for a specified purpose as part of an internal structure.

The teachings of the above patents and four co-pending applications are incorporated herein by reference. As stated, this application is a continuation-in-part of Ser. No. 11/031, 085, the third of the four applications listed above.

Generally speaking, with respect to commercially available dielectric powders which have been used in internal conductive structures such as mentioned in some of the above patents, among these being metal titanate-based powders (see, e.g., U.S. Pat. No. 6,150,456), such powders are known to be produced by a high-temperature, solid-state reaction of a mixture of the appropriate stoichiometric amounts of oxides or oxide precursors (e.g., carbonates, hydroxides or nitrates) of barium, calcium, titanium, and the like. In such calcination processes, the reactants are wet-milled to accomplish a desired final mixture. The resulting slurry is dried and fired at elevated temperatures, sometimes as high as 1,300 degrees Celsius (C.), to attain the desired solid state reactions. Thereafter, the fired product is milled to produce a powder. Although the pre-fired and ground dielectric formulations produced by solid phase reactions are acceptable for many electrical applications, these suffer from several disadvantages. First, the milling step serves as a source of contaminants, which can adversely affect electrical properties. Second, the milled product consists of irregularly shaped fractured aggregates which are often too large in size and possess a wide particle size distribution, 500-20,000 nm. Consequently, films produced using these powders are limited to thicknesses greater than the size of the largest particle. Thirdly, powder suspensions or composites produced using pre-fired ground ceramic powders must be used immediately after dispersion, due to the high sedimentation rates associated with large particles. The stable crystalline phase of barium titanate for particles greater than 200 nm is tetragonal and, at elevated temperatures, a large increase in dielectric constant occurs due to a phase transition. It is thus clear that methods of making PCBs which rely on the advantageous features of using nano-powders as part of the PCB's internal components or the like, such as those described in selected ones of the above patents, possess various undesirable aspects which are detrimental to providing a PCB with optimal functioning capabilities when it comes to internal capacitance or other electrical operation. This is particularly true when the desired final product attempts to meet today's miniaturization demands, including the utilization of high density patterns of thru-holes therein.

As defined herein, a new and unique method of making a capacitive substrate is provided in which the method can be performed in a facile manner using, for the most part, conventional substrate processes. Also provided is a method of making the circuitized substrates adapted for having one or more of such capacitive substrates as part thereof. It is believed that such methods would constitute significant advancements in the art.

OBJECTS AND SUMMARY OF THE INVENTION

It is, therefore, a primary object of the present invention to enhance the circuitized substrate art by providing a method of making a circuitized substrate having the advantageous features taught herein, including a capacitive substrate as part thereof.

It is another object of the invention to provide a method of making such a circuitized substrate which can be accomplished in a relatively facile manner and at relatively low costs.

It is still another object of the invention to provide a method of making a capacitive substrate for use in said circuitized substrates.

According to one aspect of the invention, there is provided a method of making a capacitive substrate comprising providing a conductive layer, providing a capacitive dielectric layer having first and second opposing sides, bonding the first opposing side of the capacitive dielectric layer to the conductive layer, forming at least one first conductor on the second opposing side of the capacitive dielectric layer, forming an electrical connection through the capacitive dielectric layer to the at least one first conductor, and forming at least one second conductor from the conductive layer. The at least one second conductor is not electrically connected to the at least one first conductor and electrical connection, each of the at least one first and second conductors serving as capacitor electrodes when the conductors are electrically coupled to other circuit structure and the circuit structure is operational.

According to another aspect of the invention, there is provided a method of making a capacitive substrate having first and second capacitors therein, the method comprising providing first and second conductive layers, providing first and second capacitive dielectric layers each having first and second opposing sides, bonding the first opposing side of the first capacitive dielectric layer to the first conductive layer and the first opposing side of the second capacitive dielectric layer to the second conductive layer, forming at least one first conductor on each of the second opposing sides of the first and second capacitive dielectric layers, respectively, forming an electrical connection through each of the first and second capacitive dielectric layers to the at least one first conductor on each of the second opposing sides of the first and second capacitive dielectric layers, respectively; and forming at least one second conductor from each of the first and second conductive layers, respectively. Each of the at least one second conductors are not electrically connected to the corresponding one of the at least one first conductors and electrical connections, each of the at least one first and second conductors on the first and second capacitive dielectric layers serving as capacitor electrodes for a single capacitor when the conductors are electrically coupled to other circuit structure and the circuit structure is operational.

According to yet another aspect of the invention, there is provided a method of making a circuitized substrate having a capacitive substrate therein, the method comprising providing a conductive layer, providing a capacitive dielectric layer having first and second opposing sides, bonding the first opposing side of the capacitive dielectric layer to the conductive layer, forming at least one first conductor on the second opposing side of the capacitive dielectric layer, forming an electrical connection through the capacitive dielectric layer to the at least one first conductor, forming at least one second conductor from the conductive layer, forming a dielectric layer on the capacitive dielectric layer over the at least one second conductor and electrical connection, forming third and fourth conductors on the dielectric layer, and electrically coupling the third conductor to the at least one first conductor and the fourth conductor to the electrical connection to form an electrical circuit including the at least one first and second conductors, the third and fourth conductors and the electrical connection, each of the at least one first and second conductors serving as capacitor electrodes of a capacitor within the electrical circuit when the circuit is operational.

According to still another aspect of the invention, there is provided a method of making a circuitized substrate having a capacitive substrate therein including first and second capacitors, the method comprising providing first and second conductive layers, providing first and second capacitive dielectric layers each having first and second opposing sides, bonding the first opposing side of the first capacitive dielectric layer to the first conductive layer and the first opposing side of the second capacitive dielectric layer to the second conductive layer, forming at least one first conductor on each of the second opposing sides of the first and second capacitive dielectric layers, respectively, forming first and second electrical connections through the first and second capacitive dielectric layers, respectively, to the at least one first conductor on each of the second opposing sides of the first and second capacitive dielectric layers, respectively, forming at least one second conductor from each of the first and second conductive layers, respectively, each of the at least one second conductors not being electrically connected to the corresponding one of the at least one first conductors and electrical connections, forming a dielectric layer on each of the capacitive dielectric layers over each of the at least one second conductors and electrical connections, respectively, forming third and fourth conductors on one of these dielectric layers, and fifth and sixth conductors on a second of these dielectric layers, respectively, electrically coupling the third conductor to one of the at least one first conductors and the fourth conductor to the first electrical connection to form a first electrical circuit including the at least one first and second conductors, the third and fourth conductors and the first electrical connection, each of the at least one first and second conductors serving as capacitor electrodes of a first capacitor within the electrical circuit when the first electrical circuit is operational, and electrically coupling the fifth conductor to one of the at least one first conductors and the sixth conductor to the second electrical connection to form a second electrical circuit including the at least one first and second conductors, the fifth and sixth conductors and the second electrical connection, each of the at least one first and second conductors serving as capacitor electrodes of a second capacitor within the second electrical circuit when this second electrical circuit is operational.

BEST MODE OF CARRYING OUT THE INVENTION

Figure 1:
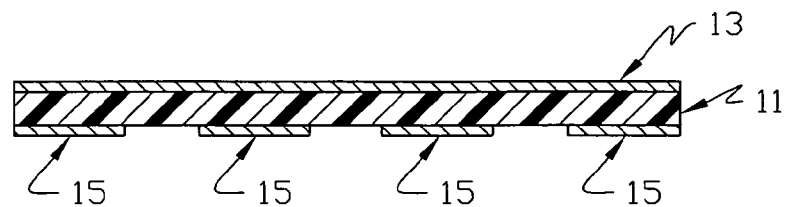
FIGS. 1-6 illustrate the steps of making a capacitive substrate according to one aspect of the invention, FIGS. 4-6 being on an enlarged scale over FIGS. 1-3.

For a better understanding of the present invention, together with other and further objects, advantages and capabilities thereof, reference is made to the following disclosure and appended claims in connection with the above-described drawings. Like figure numbers may be used from FIG. to FIG. to identify like elements in these drawings.

By the term "circuitized substrate" as used herein is meant to include substrates having at least two (and preferably more) dielectric layers and at least two (and preferably more) metallurgical conductive layer(s). Examples include structures made of dielectric materials such as fiberglass-reinforced epoxy resins (some referred to as "FR-4" dielectric materials in the art), polytetrafluoroethylene (Teflon), polyimides, polyamides, cyanate resins, photo-imageable materials, and other like materials wherein the conductive layers are each a metal layer (e.g., power, signal and/or ground) comprised of suitable metallurgical materials such as copper, but may include or comprise additional metals (e.g., nickel, aluminum, etc.) or alloys thereof. Further examples will be described in greater detail herein-below. If the dielectric materials for the structure are of a photo-imageable material, it is photo-imaged or photo-patterned, and developed to reveal the desired circuit pattern, including the desired opening(s) as defined herein, if required. The dielectric material may be curtain-coated or screen-applied, or it may be supplied as dry film. Final cure of the photo-imageable material provides a toughened base of dielectric on which the desired electrical circuitry is formed. An example of a particularly useful photo-imageable dielectric is ASMDF (Advanced Soldermask Dry Film). This composition, which is further described in U.S. Pat. No. 5,026,624, which issued Jun. 25, 1991, and U.S. Pat. No. 5,300,402, which issued Apr. 25, 1994, includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photo-initiator; 0.07% ethylviolet dye; 0.03% FC 430, a fluorinated polyether nonionic surfactant from 3M Company; 3.85% Aerosil 380, an amorphous silicon dioxide from Degussa to provide the solid content. A solvent is present from about 11 to about 13.5% of the total photo-imageable dielectric composition. Examples of circuitized substrates include those usable for printed circuit boards (or cards) and chip carriers. It is believed that the teachings of the instant invention are also applicable to what are known as "flex" circuits (which use dielectric materials such as polyimide) and those which use ceramic or other non-polymer type dielectric layers, one example of the latter being what are referred to as multilayered ceramic (MLC) modules adapted for having one or more semiconductor chips mounted thereon.

By the term "ferroelectric ceramic" as used herein is meant ceramics that possess ferroelectric properties. These include barium titanate, substituted barium titanate, strontium titanate, lead titanate, lead zirconate titanate, substituted lead zirconate titanate, lead magnesium niobate, lead zinc niobate, lead iron niobate, solid solutions of lead magnesium niobate and lead titanate, solid solutions of lead zinc niobate and lead titanate, lead iron tantalite, other ferroelectric tantalates, and combinations or mixtures thereof.

By the term "electrical component" as used herein is meant components such as semiconductor chips and the like which are adapted for being positioned on the external conductive surfaces of such substrates and electrically coupled to the substrate for passing signals from the component into the substrate whereupon such signals may be passed on to other components, including those mounted also on the substrate, as well as other components such as those of a larger electrical system in which the substrate is positioned.

By the term "electrical assembly" is meant at least one circuitized substrate as defined herein in combination with at least one electrical component electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface or to internal conductors using one or more thru-holes. Perhaps the most well known such assembly is the conventional printed circuit board (PCB) typically having several external components such modules (including one or more chip carriers), semiconductor chips, etc. mounted thereon and coupled to the internal circuitry of the PCB.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc. Such systems typically include one or more PCBs, chip carriers, etc. as integral parts thereof. For example, a PCB typically used includes a plurality of various components such as chip carriers, capacitors, resistors, modules, etc. mounted thereon. One such PCB may be referred to as a "motherboard" while various other boards (or cards) may be mounted thereon using suitable electrical connectors.

By the term "thru-hole" as used herein is meant to include what are also commonly referred to in the industry as "blind vias" which are openings typically from one surface of a substrate to a predetermined distance therein, "internal vias" which are vias or openings located internally of the substrate and are typically formed within one or more internal layers prior to lamination thereof to other layers to form the ultimate structure, and "plated through holes" (also known as PTHS), which typically extend through the entire thickness of a substrate. All of these various openings form electrical paths through the substrate and often include one or more conductive layers, e.g., plated copper, thereon. These openings are formed typically using mechanical drilling or laser ablation.

In FIG. 1, a layer 11 of capacitive dielectric material is provided. In a preferred embodiment, this material is a combination of a cycloaliphatic epoxy resin, hexahydro-4-methylphthalic anhydride, dimethyl benzylamine and an epoxy novolac resin. A preferred cycloaliphatic epoxy resin is one sold under product designation "ERL 4211" by the Union Carbide Corporation, Danbury, Conn. A preferred epoxy novalac resin is one sold under product designation "LZ 8213", by Huntsman, Salt Lake City, Utah. Included as part of this polymer material is a quantity of barium titanate powder, a ferroelectric ceramic crystalline nanoparticle material as mentioned above. Examples of how this capacitive dielectric material is formed are provided below, as are other examples of such material. (It is understood that the invention is not limited to use of these specific materials as others known in the art are also usable in the invention, as are other proportions thereof.) This capacitive dielectric layer must now be bonded to a conductive layer 13, preferably of copper or copper alloy. In a preferred embodiment, such bonding is accomplished when layer 11 is deposited atop layer 13 either in paste form using a screen printing operation or in ink form using a ink-jet printing operation or in slurry form using a coating operation such as roller coating, drawdown, meniscus or any other coating operation commonly known in the industry. If deposited as a paste, the paste is then substantially fully cured over its deposition state. In one embodiment, such curing occurs for a predetermined time period (in one example, for a period of from about 100 minutes to about 140 minutes, and preferably at 120 minutes) at a predetermined temperature within the range of from about 180 degrees Celsius (C) to about 200 degrees C., preferably 190 degrees C. In one embodiment, conductive layer 13 is formed from a single sheet of material. In this embodiment, layer 11 may possess a thickness of from about 0.1 mil to about five mils (a mil being one-thousandths of an inch) while conductor 13 includes a thickness of from about 0.2 mils to about 2.5 mils.

On the bottom surface of layer 11 are formed a plurality of individual conductors 15, also preferably of copper or copper alloy (other possible metals include silver or silver alloy, or gold or gold alloy), and each of a thickness of from about 0.1 mil to about 2.5 mils. Conductors 15 may be formed from a singular layer such as layer 13 and then subjected to photolithographic processing to form each individual conductor, or, alternatively (and preferably), may be individually formed using conventional sputtering processing followed by electroplating. During such sputtering a thin layer of metal, preferably copper, is vacuum deposited on layer 11, preferably at a thickness of about 0.5 microns to about five microns, a most preferred thickness being about one micron. Sputtering may also include a barrier metal layer prior to the copper layer. The barrier layer is typically comprised of chrome or titanium with a thickness of 50 Angstroms to about 500 Angstroms. The sputtered copper layer is used as a seed layer for subsequent copper electroplating. Electroplating is preferably pattern plating whereby a layer of photo-resist is applied to the sputtered copper layer and imaged and developed in the desired pattern for conductors 15. Electroplating then occurs in the developed photo-resist openings. Following electrolytic pattern plating, the photo-resist is stripped away and then the thin sputtered copper and barrier metal, if applicable, are etched. It is also possible to use a polymer thick film conductor material to form individual conductors 15. When using conductive polymer thick film materials, the individual conductors 15 are formed directly by means of screen or ink-jet printing. It is understood that many such conductors may be formed and the number illustrated (four) is not limiting of the scope of the invention.

Figure 2:
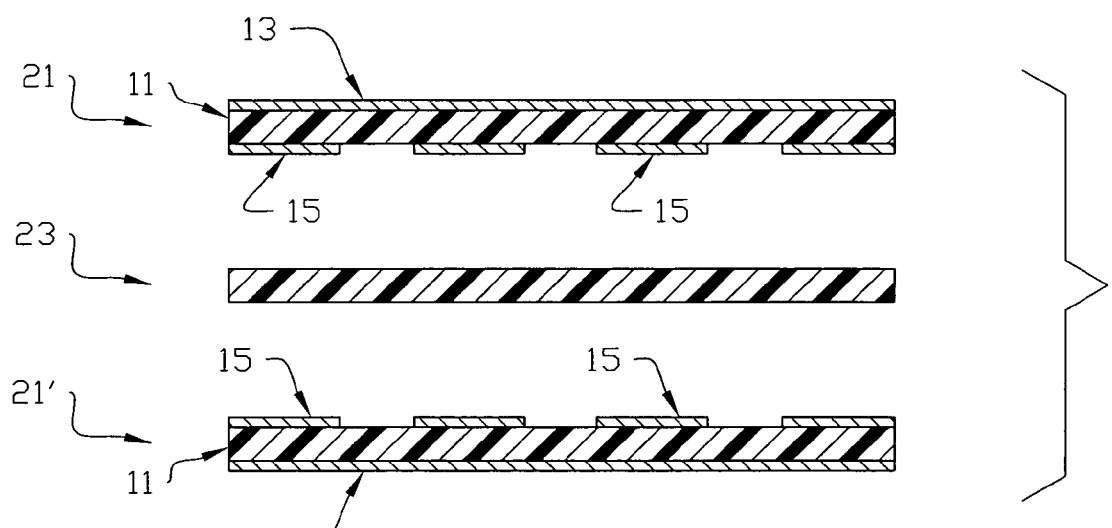

In FIG. 2, the capacitive substrate 21 formed as defined above is aligned with a second, similar substrate 21', separated by a conventional dielectric sheet 23. Sheet 23 is preferably the aforementioned "FR 4" resin material, often used in conventional PCB lamination. Substrates 21 and 21' are preferably oriented in a "facing" orientation in which the conductors 15 face each other, separated of course by sheet 23. In an embodiment where substrates 21 and 21' have materials of a thickness as taught above, the corresponding thickness of interim sheet 23 is preferably only about two mils to about five mils.

Figure 3:
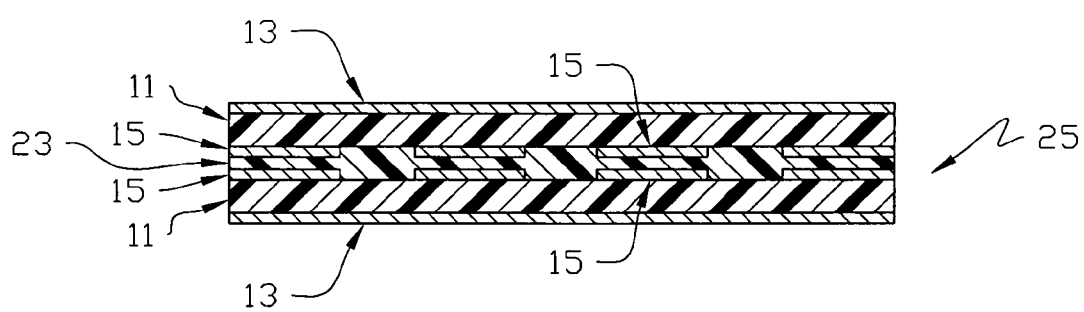

In FIG. 3, the three elements of FIG. 2 are bonded together, preferably utilizing a conventional PCB lamination process. In one embodiment, this process is conducted at a temperature within the range of from about 180 degrees C. to about 200 degrees C., for a time period of from about ninety minutes to about 120 minutes. The pressure applied onto the elements during such lamination is preferably from about 200 pounds per square inch (p.s.i.) to about 700 p.s.i. The composite structure shown in FIG. 3 is the result. The structure (25) will preferably possess an overall thickness of from about three mils to about twenty-five mils, ideally suited for further substrate processing in which the structure will form part of a thicker structure having more layers as part thereof.

Figure 4:
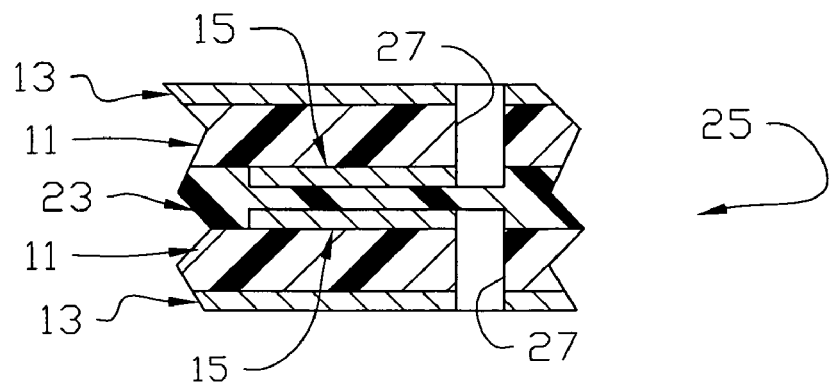

FIG. 4 represents the next step in making a capacitive substrate according to one embodiment of the invention. Here, holes 27 are formed, preferably using a mechanical or laser drilling operation, the holes formed through both opposing layers 13 and the thickness of dielectric layers 11 to respectively physically engage the corresponding conductors 15. Although the holes are shown immediately adjacent conductors 15, it is within the scope of this invention to provide same downwardly to the upper (or lower in the case of lower conductor 15) surface of each conductor. This may be preferred in an embodiment in which laser drilling is used, such that the internal conductors 15 can assist in defining the depth of the laser-formed holes. In one embodiment, each hole 27 preferably possesses a diameter of from about two mils to about eight mils, a preferred diameter being only three mils, and is drilled to a depth of from about two mils to completely through the capacitive substrate 25. Such extremely small diameters illustrate the relatively high densities attainable using the teachings of this invention.

Although FIGS. 1-6 depict the simultaneous formation of at least two "facing" capacitors within a singular capacitive substrate, the invention is not so limited, as it is within the scope of this invention to only provide one capacitor within a structure such as that shown in FIG. 1, without the addition of a second structure. Providing a second substrate 21', especially one with several additional conductors able to also constitute capacitor electrodes (see more below), however, enhances the invention because it allows simultaneous formation of several capacitors. In an embodiment as illustrated in FIGS. 1-6, it is possible to form as many as 10,000 capacitors within the composite structure 25 resulting in FIG. 3. This represents a significant aspect of the invention because it assures that a final circuitized substrate desiring such a number of internal capacitor elements will be able to have these readily incorporated therein without the necessity of individual capacitor formation prior to incorporation, and the undesirable additional costs associated with same. The number of capacitors formed, of course is dependent on the substrate size, the capacitor values desired and the desired function of the finished substrate. Utilizing a second substrate 21' also allows for providing different capacitance densities between the multiple layers, thus providing for a very broad range of final capacitor values.

Figure 5:
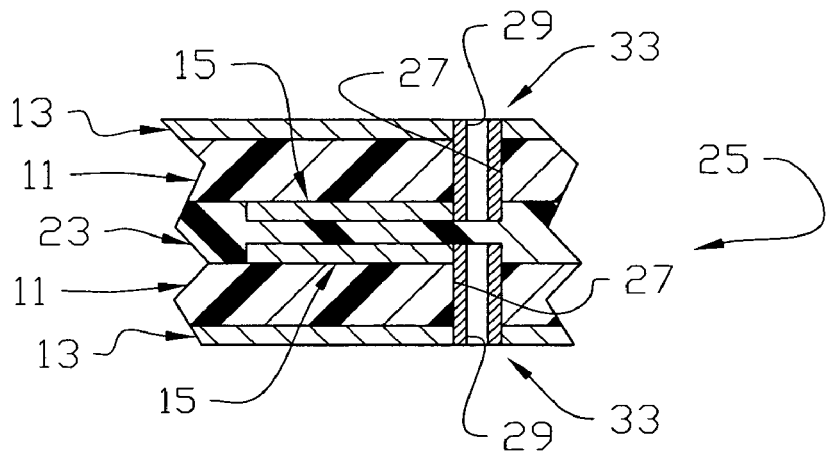

Following formation of holes 27, each hole is then plated with sound conductive metallurgy 29, as seen in FIG. 5. In a preferred embodiment, this involves use of electroplating processing as is used in the formation of known PTH'S, in which a first thin layer of palladium seed is applied, followed by a thin layer of electro-less copper and finally a thicker layer of electrolytic copper. In one embodiment, the total thickness of both copper layers combined is 0.5 mils. As is understood, other metallurgies and thicknesses are possible. The resulting connection is a thru-hole 33.

Figure 6:
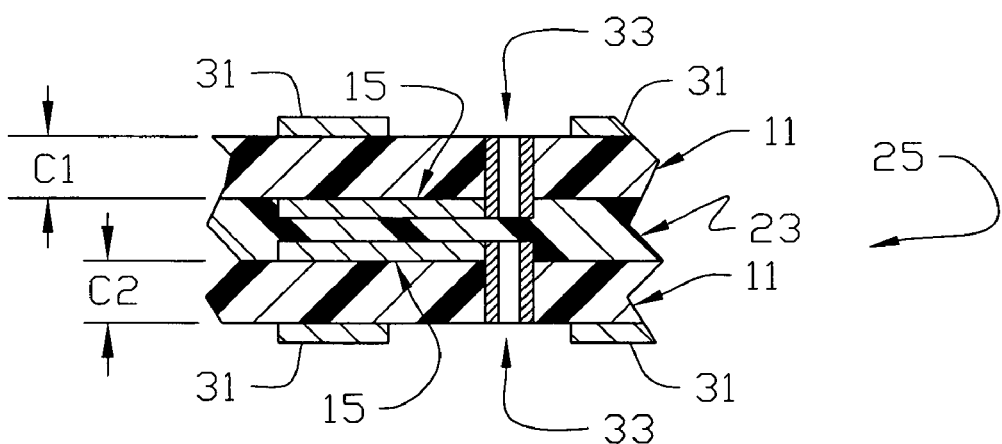

In FIG. 6, each of the outer conductive layers 13 is "circuitized," meaning that at least one conductor 31 is formed from each of the originally solid layers 13 for each of the desired capacitor structures. This newly formed conductor 31 is to serve as one of the electrodes for the capacitor on the respective side of the structure, the adjacent conductor 15 forming the other electrode for the pair. That is, each of the formed capacitors (two in FIG. 6) will be comprised of one electrode 31 and another 15. Only the "inner" electrode 15 is electrically connected to thru-hole 33. It is understood that at least one conductor 31 is formed adjacent each respective inner conductor 15, such that a total of eight such conductors 31 will be formed using a structure as shown in FIG. 3. (Only two opposed capacitive pairs are shown in FIGS. 4-7 for ease of illustration, with adjacent conductors 31 of another capacitor structure also being partially shown to the right of those defined above.) The resulting two capacitors shown in FIG. 6 will each have a capacitance value, which, for illustration purposes, is shown by C1 for the upper capacitor and C2 for the lower capacitor. In one example, C1 may have a value of 1 nF/inch$^2$, while C2 may possess a value of 100 nF/inch$^2$.

According to the unique teachings of the instant invention, it is possible to vary the capacitance values of the capacitors formed by varying the thicknesses of the capacitance dielectric materials and/or the materials themselves. The Examples cited below represent various materials which can be used, and the TABLES below represent the various capacitance values when using alternative thicknesses and materials. This represents a significant aspect of this invention because it enables the substrate manufacturer to meet the operational requirements of many circuit designs by simply providing different capacitance dielectric materials and/or modifying the thicknesses thereof. A further significant aspect of the invention is that capacitors formed on the opposing structures 21 and 21' can be connected to each other with the plated thru holes and/or circuit features on the conductor layers. These connections can be either series or parallel connections. Thus, with the various electrode sizes, dielectric materials and thicknesses, an infinite number of capacitor values can be achieved in a single substrate. Each of the TABLES 1-4 below illustrate two or more different capacitor dielectric materials, laminated together using conventional FR4 pre-preg. material, and the resulting capacitor value of a 0.1 inch square capacitor with either series or parallel connection.

TABLE 1

| Capacitance layer (thickness = 2.5 micron) | Capacitance Density (nF/inch$^2$) | (0.1" × 0.1") Capacitor (pF) | Total capacitor through series connection (1/C = 1/C1 + 1/C2) | Total capacitor through parallel connection (C = C1 + C2) |
|---|---|---|---|---|
| C1 | 55 | 550 | 147 pF | 750 pF |
| C2 | 20 | 200 | | |

TABLE 2

| Capacitance layer (thickness = 2.5micron) | Capacitance Density (nF/inch$^2$) | (0.1" × 0.1") Capacitor (pF) | Total capacitors through series connection (1/C = 1/C3 + 1/C4) | Total capacitors through parallel connection (C = C3 + C4) |
|---|---|---|---|---|
| C3 | 42.5 | 425 | 184 pF | 750 pF |
| C4 | 32.5 | 325 | | |

TABLE 3

Top two and bottom two layers connected parallel with each other. Individual top two capacitors and bottom two capacitors connected either in series or parallel

| Capacitance layer (thickness = 2.5 micron) | Capacitance Density (nF/inch$^2$) | (0.1" × 0.1") Capacitor (pF) | Capacitors connected through parallel connection | Total capacitors through series connection (1/C = 1/C$_{1+3}$ + 1/C$_{2+4}$) | Total capacitors through parallel connection (C = C$_{1+3}$ + C$_{2+4}$) |
|---|---|---|---|---|---|
| C1 | 55 | 550 | 975 pF | 341 pF | 1500 pF |
| C3 | 42.5 | 425 | (C$_{1+3}$ = C1 + C3) | | |

TABLE 3-continued

Top two and bottom two layers connected parallel with each other. Individual top two capacitors and bottom two capacitors connected either in series or parallel

| Capacitance layer (thickness = 2.5 micron) | Capacitance Density (nF/inch$^2$) | Capacitors (0.1" × 0.1") Capacitor (pF) | Capacitors connected through parallel connection | Total capacitors through series connection (1/C = 1/$C_{1+3}$ + 1/$C_{2+4}$) | Total capacitors through parallel connection (C = $C_{1+3}$ + $C_{2+4}$) |
|---|---|---|---|---|---|
| C2 | 20 | 200 | 525 pF | | |
| C4 | 32.5 | 325 | ($C_{2+4}$ = C2 + C4) | | |

TABLE 4

Top two and bottom two layers connected in series with each other. Individual top two capacitors and bottom two capacitors again connected either in series or parallel

| Capacitance layer (thickness = 2.5 micron) | Capacitance Density (nF/inch$^2$) | Capacitors (pF) (0.1 inch × 0.1 inch) | Capacitors connected through series connection | Total capacitors through series connection (1/C = 1/$C_{1+3}$ + 1/$C_{2+4}$) | Total capacitors through parallel connection (C = $C_{1+3}$ + $C_{2+4}$) |
|---|---|---|---|---|---|
| C1 | 55 | 550 | 240 pF | 82 pF | 364 pF |
| C3 | 42.5 | 425 | ($C_{1+3}$ = C1.C3/(C1 + C3)) | | |
| C2 | 20 | 200 | 124 pF | | |
| C4 | 32.5 | 325 | ($C_{2+4}$ = C2.C4/(C2 + C4)) | | |

TABLE 5

Materials with different composition, thickness and capacitance density and thickness

| Materials/Particle size | Thickness (microns) | Capacitance Density (nF/inch$^2$) |
|---|---|---|
| BaTiO$_3$ (120 nm + 65 nm)/Polymer (Epoxy Novolac + PKHC) | 2.5 microns | 80 nF/inch$^2$ |
| BaTiO$_3$ (120 nm + 65 nm)/Polymer (Epoxy Novolac + PKHC) | 5 microns | 40 nF/inch$^2$ |
| BaTiO$_3$ (120 nm)/Polymer (Epoxy Novolac + PKHC) | 8.5 microns | 25 nF/inch$^2$ |
| BaTiO$_3$ (120 nm)/Polymer (Epoxy Novolac + PKHC) | 25 microns | 9 nF/inch$^2$ |
| BaTiO$_3$ (120 nm) + TiO$_2$(10 nm)/Polymer (Epon + PKHC) | 5 microns | 15 nF/inch$^2$ |

Figure 7:
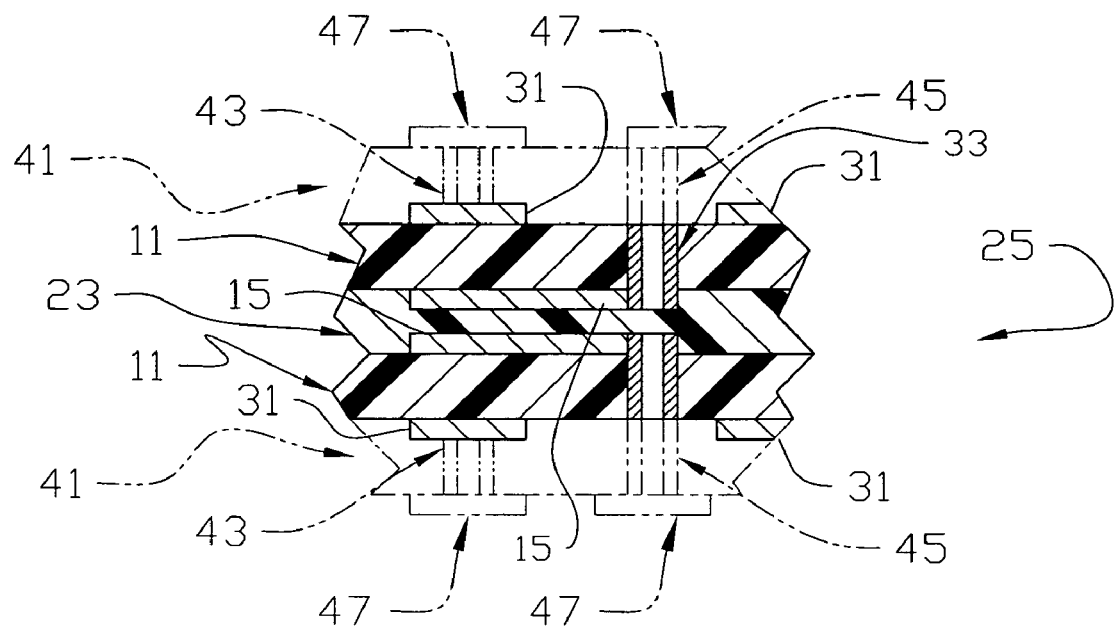
FIG. 7, on the same scale as FIGS. 4-6, illustrates one embodiment of making a circuitized substrate which may include one of the capacitive substrates of the invention.

FIG. 7 represents the addition of at least one more dielectric layer 41 (phantom) atop each of the outer dielectric layers 11 having conductors 31 thereon, this added dielectric layer also covering each conductor 31. In addition, layers 41 cover the thru-hole connections 33. In one embodiment, dielectric layers 41 may be comprised on the above-mentioned "FR 4" material and applied using conventional lamination processing. In this case, temperatures, pressures and time periods similar to those defined above regarding the lamination of the FIG. 2 structure are possible. Following lamination, thru-hole connections 43 and 45 are formed, using similar methodology defined above for the formation of thru-holes 33. Then, external conductors 47 are formed, preferably using conventional PCB photolithographic processing in which a photo-resist is applied over a solid layer of conductor (e.g., copper), selected portions thereof are exposed and developed, and non-protected areas of the underlying copper layer are etched away. Further description 30 is not deemed necessary. In one embodiment, each external conductor 47 may have a thickness of 2 mils with each of the thru-holes preferably having similar metallurgies and thicknesses as thru-holes 33.

The FIG. 7 embodiment thus illustrates two separate and electrically isolated capacitors, each on an opposite side of the interim dielectric layer 23. For ease of description, only one of these will be described. The upper capacitor forms part of a first circuit including, in order, a first outer conductor 47 (the one to the left in FIG. 7), thru-hole 43, and conductor (electrode) 31. The remainder of this first circuit includes the opposing conductor (electrode) 15, thru-hole 33, thru-hole connection 45, and outer conductor 47 (the one to the right in FIG. 7). When electrical current is passed through this first circuit, conductors 15 and 31 form the electrodes for the circuit's capacitor. A similar, albeit reverse image second circuit is formed for the lower capacitor. It is understood that although only one added dielectric layer 41 is provided for each side of the initial FIG. 6 structure, several additional such layers and corresponding "circuitization" atop each are also possible, such that significantly more complex circuits may be formed on each side of the structure. As stated, it is also within the scope of the invention to only provide capacitors along one side of a structure such as shown in FIG. 1, especially if it is desirable to only use such internal capacitors on one side of a much larger (and thicker) final structure (e.g., a PCB). Such internal capacitors are especially desired immediately below surface components mounted on the final structure's external surface.

Figure 8:
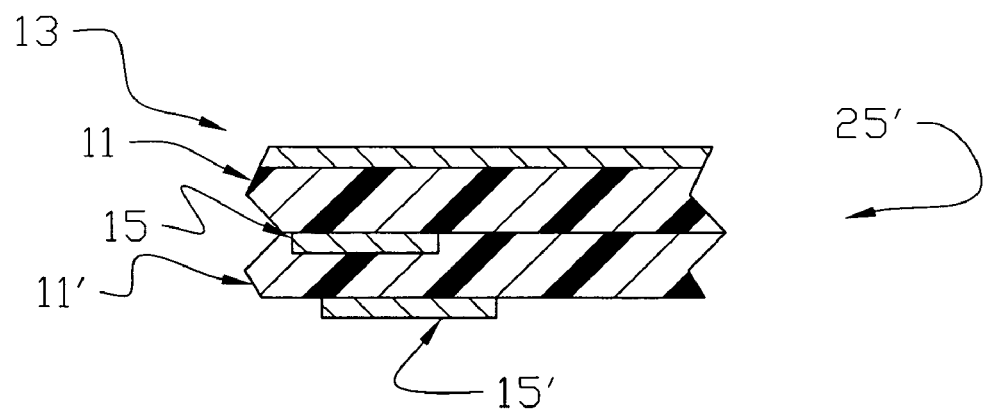
FIG. 8, also on the same scale as FIGS. 4-6, illustrates one embodiment of making a capacitive substrate having at least two capacitors therein.

FIG. 8 is a partial view, on the same scale as FIGS. 4-7, illustrating an alternative capacitive substrate 25' of the invention. This embodiment differs over substrate 25 by the addition of a second dielectric layer 11' over formed conductor 15 and the first layer 11. Layer 11' is preferably of the same material as layer 11 and is also preferably laminated using conventional PCB lamination processing. Once in place, a second conductor 15' is formed, using the preferred sputtering and electroplating operations used for conductor 15. It is noted that lower conductor 15' is slightly offset from the upper conductor 15, for reasons explained below. The structure of FIG. 8 may now be aligned with a similar structure as was the structure in FIG. 1, to form a plurality of "facing" capacitors, or the FIG. 8 structure can be used as is for further processing.

Figure 9:
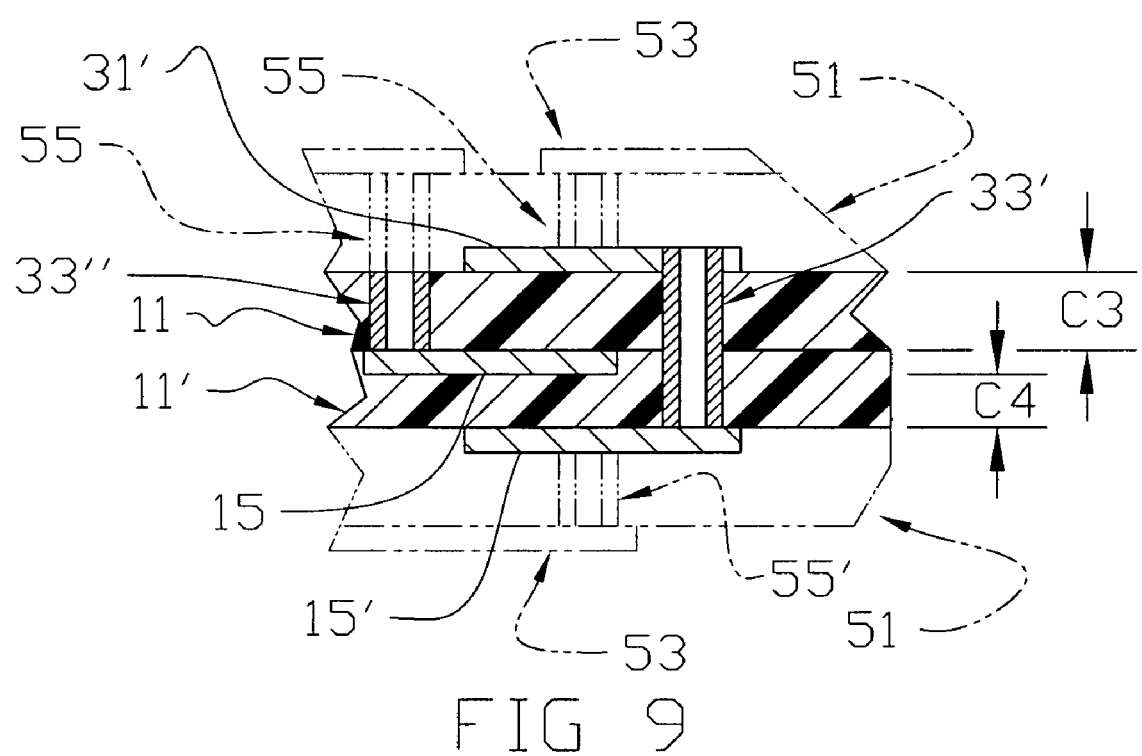
FIG. 9, also on the same scale as FIGS. 4-6, represents one embodiment of making a circuitized substrate having therein a dual capacitor substrate such as shown in FIG. 8.

In FIG. 9, the singular structure of FIG. 8 is now further processed similarly to the aforementioned structure of FIG. 1 in that one or more external conductors 31' (only one shown in FIG. 9) are formed from initial metal layer 13. Notably, at least part (that to the right) of one such external conductor 31' is also substantially aligned with the internal conductor 15'. Thru-holes 33' and 33" are then drilled to make physical contact with conductors 15' and 15, respectively, each thru-hole then plated similarly to the plating of thru-holes 33 above. Additional dielectric layers 51 (phantom) and conductors 53 (also phantom) may also be added if more operational capacity is desired for the FIG. 9 structure. Electrical connections between desired conductors may also be provided by added thru-holes 55 (also in phantom). The resulting structure of FIG. 9 thus includes at least two capacitors (illustrated by the capacitance values C3 and C4) formed by conductors/electrodes 15, 15' and 31'. The outer conductors (electrodes) 15' and 31' may be, as shown, further coupled to additional parts of the circuit arrangement for the structure, as desired. These two capacitors are thus in parallel in said circuit.

In a still further embodiment, it is possible to extend a thru-hole connection through the FIG. 5 structure so as to couple the thru-hole to selected internal conductors and thus form alternative capacitors. For example, the upper thru-hole 33 in FIG. 5 could by-pass conductor 15 (to which it is shown connected in FIG. 5) and instead be coupled to the internal conductor 15 beneath the original internal conductor. This thru-hole could then be coupled to the surface conductor 31 (once formed) and the second conductor 15, leaving the initial conductor 15 as the interim conductor of another parallel capacitor tandem. Various other alternative embodiments are well within the scope of those skilled in the art and further description is not deemed necessary.

The following examples represent various combinations of capacitor dielectric materials and processes used to form capacitors according to various aspects of the invention. These are understood to be examples only and not limiting of the scope of this invention.

EXAMPLE ONE

Fifty grams (gm) of cycloaliphatic epoxy resin (e.g., one sold under product designation "ERL-4211" by the Union Carbide Corporation, Danbury, Conn.) was mixed with about fifty grams (gm) of hexahydro-4-methylphthalic anhydride and 0.4 gm N,N dimethyl benzylamine. The mixed solution was stirred for ten minutes to assure uniform mixing. Sixty gm of barium titanate ($BaTiO_3$) powder available from the Nippon Chemical Industrial Co., Ltd., of Tokyo, Japan was added to 17.5 gm of the mixed solution and formed into a screen printable paste. A layer of this material was screened through a 145 mesh screen onto the top surface of a copper first electrical conductor. This layer was then cured at approximately 150° C. for about two hours. The second electrical conductor was then formed using a sputtering operation atop the cured screen printed material using a mask normally used for such sputtering operations. The resulting capacitance density of the formed capacitor measured about 5.5 nano-Farads(nF)/square inch, with a dielectric loss of only about 0.02 at 1 Mega-Hertz (MHz). The average (mean) particle size for the added powder was about 0.5 micron, the surface area about 2.65 square meters/gm, and the specific gravity about 5.30.

EXAMPLE TWO

As in Example One, fifty grams (gm) of "ERL-4211" cycloaliphatic epoxy resin was mixed with about fifty gm of hexahydro-4-methylphthalic anhydride and 0.4 gm N,N dimethyl benzylamine. The mixed solution was stirred for ten minutes to assure uniform mixing. 150 gm of a combination of barium titanate, calcium titanate and zirconium powders (also available from the Nippon Chemical Industrial Co., Ltd. Tokyo, Japan) was mixed thoroughly with 100 gm of the mixed solution and formed into a screen printable paste. A layer of this material was screened through a 200 mesh screen onto the top surface of a copper first electrical conductor. This layer was then cured at approximately 150° C. for about two hours, as in Example One. The second electrical conductor was then formed using a sputtering operation atop the cured screen printed material using a mask normally used for such sputtering operations. The average (mean) particle size for the added powder was about 0.2 micron, the surface area about 8.25 square meters/gm, and the specific gravity about 5.15.

EXAMPLE THREE

As in Examples One and Two, fifty grams (gm) of "ERL-4211" cycloaliphatic epoxy resin was mixed with about fifty gm of hexahydro-4-methylphthalic anhydride and 0.4 gm N,N dimethyl benzylamine. The mixed solution was stirred for ten minutes to assure uniform mixing. 150 gm of Nippon Chemical Industrial's barium titanate powder was mixed thoroughly with 100 gm of the mixed solution and made into a screen printable paste. A layer of this paste material was screened through a 200 mesh screen onto the top surface of a copper first electrical conductor. This layer was then cured at approximately 150° C. for about two hours, as in Example One. The second electrical conductor was then formed using a sputtering operation atop the cured screen printed material using a mask normally used for such sputtering operations. The average (mean) particle size for the added powder was about 0.1 micron, the surface area about 15.08 square meters/gm, and the specific gravity about 5.52.

EXAMPLE FOUR

Fifty grams (gm) of "ERL-4211" cycloaliphatic epoxy resin was mixed with about fifty gm of hexahydro-4-methylphthalic anhydride, 0.4 gm N,N dimethyl benzylamine and twenty gm of an epoxy novolac resin (e.g. one sold under product designation "LZ 8213", by Huntsman, Salt Lake City, Utah). The mixed solution was stirred for thirty minutes to assure uniform mixing. 120 gm of Nippon Chemical Industrial's barum titanate powder was added to 56 gm of the mixed solution and formed into a screen printable paste. A layer of this material was screened through a 200 mesh screen onto the top surface of a copper first electrical conductor. This layer was then cured at approximately 150° C. for about two hours, followed by an additional cure at approximately 190° C. for about one hour. The second electrical conductor was then formed using a sputtering operation followed by a copper electroplating process and a photolithographic etch step. The resulting capacitance density of the formed capacitor measured about 5.5 nano-Farads (nF)/square inch, with a dielectric loss of only about 0.02 at 1 mega-Hertz (mHz). The average (mean) particle size for the added powder was about 0.5 micron, the surface area about 2.65 square meters/gm, and the specific gravity about 5.30.

EXAMPLE FIVE 38.5 grams (gm) of an epoxy novolac resin sold under the product name "LZ 8213" from Huntsman, Salt Lake City, Utah, containing about 35 wt % methyl ethyl ketone and 6.5 gm of a phenoxy resin sold under the product name "PKHC" from Phenoxy Associates, Rock Hill, S.C., containing 50 wt % methyl ethyl ketone were mixed together with 100 gm of barium titanate (BaTiO3) powder available from Cabot Corporation, Boyertown, Pa. ((50 gm BaTiO3 with a mean particle size=0.065 micron, surface area=16 m2/gm) and (50 gm BaTiO3 with mean particle size=0.12 micron, surface area=8.2 m2/gm)), thirteen gm propylene glycol methyl ether acetate) and twelve gm methyl ethyl ketone) and ball milled for three days. Around 2.5 micron thin film of this mixed composite was then deposited on a copper substrate and dried at approximately 140° C. for three minutes in an oven to remove residual organic solvents. This was followed by curing in an oven at 190° C. for two hours. A second electrical conductor was then formed using a sputtering operation atop the cured film using a mask normally used for such sputtering operations. The resulting capacitance density of the formed capacitor measured about 80 nano-Farads (nF)/square inch at 1 Mega-Hertz (MHz).

EXAMPLE SIX 25 gm of "LZ 8213" epoxy novolac resin containing about 35 wt % methyl ethyl ketone was mixed together with ninety gm of barium titanate powder (available from the Nippon Chemical Industrial Co., Ltd., of Tokyo, Japan) having a mean particle size of 0.5 micron and particle surface area of about 2.65 $m^2$/gm and 50 gm methyl ethyl ketone, and ball milled for three days until a homogeneous slurry was observed. Around 2.5 micron thin film of this mixed composite was then deposited on a copper substrate and dried at approximately 140° C. for three minutes in an oven to remove residual organic solvents. This was followed by curing in an oven at 190° C. for two hours. A second electrical conductor was then formed using a sputtering operation atop the cured film using a mask normally used for such sputtering operations. The resulting capacitance density of the formed capacitor measured about 55 nano-Farads (nF)/square inch at 1 Mega-Hertz (MHz).

EXAMPLE SEVEN

Fifty gm of "LZ 8213" epoxy novolac resin containing about 35 wt % methyl ethyl ketone was mixed together with fifty gm of barium titanate powder (available from the Nippon Chemical Industrial Co., Ltd., of Tokyo, Japan) having a mean particle size of 0.5 micron and particle surface area of about 2.65 $m^2$/gm and twenty gm methyl ethyl ketone, and ball milled for three days until a homogeneous slurry was observed. Around 2.5 micron thin film of this mixed composite was then deposited on a copper substrate and dried at approximately 140° C. for three minutes in an oven to remove residual organic solvents. This was followed by curing in an oven at 190° C. for two hours.

A second electrical conductor was then formed using a sputtering operation atop the cured film using a mask normally used for such sputtering operations. The resulting capacitance density of the formed capacitor measured about 20 nano-Farads(nF)/square inch at 1 Mega-Hertz (MHz).

EXAMPLE EIGHT

Ninety gm of a combination of barium titanate, calcium titanate and zirconium powders (also available from the Nippon Chemical Industrial Co., Ltd. Tokyo, Japan) powder having a mean particle size of about 0.2 micron and surface area of about 8.25 $m^2$/gm was mixed with thirty gm of "LZ 8213" epoxy novolac resin containing about 35 wt % methyl ethyl ketone and thirty gm methyl ethyl ketone and ball milled for three days, until an homogeneous slurry was observed. Around 2.5 micron thin film of this mixed composite was then deposited on a copper substrate and dried at approximately 140° C. for three minutes in an oven to remove residual organic solvents. This was followed by curing in an oven at 190° C. for two hours. A second electrical conductor was then formed using a sputtering operation atop the cured film using a mask normally used for such sputtering operations. The resulting capacitance density of the formed capacitor measured about 42.5 nano-Farads(nF)/square inch at 1 Mega-Hertz (MHz).

EXAMPLE NINE

Fifty gm of a combination of barium titanate, calcium titanate and zirconium powders (also available from the Nippon Chemical Industrial Co., Ltd. Tokyo, Japan) powder having a mean particle size of about 0.2 micron and surface area of about 8.25 $m^2$/gm was mixed with fifty gm of "LZ 8213" epoxy novolac resin containing about 35 wt % methyl ethyl ketone and 44 gm methyl ethyl ketone and ball milled for three days, until an homogeneous slurry was observed. Around 2.5 micron thin film of this mixed composite was then deposited on a copper substrate and dried at approximately 140° C. for three minutes in an oven to remove residual organic solvents. This was followed by curing in an oven at 190° C. for two hours. A second electrical conductor was then formed using a sputtering operation atop the cured film using a mask normally used for such sputtering operations. The resulting capacitance density of the formed capacitor measured about 32.5 nano-Farads(nF)/square inch at 1 Mega-Hertz (MHz).

EXAMPLE TEN

Thirty gm of "LZ 8213" epoxy novolac resin containing about 35 wt % methyl ethyl ketone was mixed together with ninety gm of barium titanate powder (available from the Nippon Chemical Industrial Co., Ltd., of Tokyo, Japan) having a mean particle size of 0.1 micron and particle surface area of about 15.08 $m^2$/gm and 80 gm methyl ethyl ketone, and ball milled for three days until a homogeneous slurry was observed. Around 2.5 micron thin film of this mixed composite was then deposited on a copper substrate and dried at approximately 140° C. for three minutes in an oven to remove residual organic solvents. This was followed by curing in an oven at 190° C. for two hours. A second electrical conductor was then formed using a sputtering operation atop the cured film using a mask normally used for such sputtering operations. The resulting capacitance density of the formed capacitor measured about 42.5 nano-Farads(nF)/square inch at 1 Mega-Hertz (MHz).

Thus there has been shown and described a capacitive substrate having one or more capacitors as part thereof, which substrate can be formed using many conventional PCB processes to thereby reduce costs associated with production thereof. This capacitive substrate can then be incorporated into a larger structure, including by laminating other dielectric layers and forming other circuit elements as part thereof, if desired. There have also been defined several examples of capacitor dielectric materials which can be used between two or more opposing conductors as part of such a unique internal capacitor structure. The invention as defined herein, if desired, is capable of transmitting both regular and high speed (frequency) signals, the latter at a rate of from about one Gigabits/sec to about ten Gigabits/second, while substantially preventing impedance disruption. As stated, it is also capable of being produced using many conventional PCB processes so as to assure reduced cost and facilitate ease of manufacture. That is, the preferred method for assembling the substrates taught herein preferably involves the use of conventional lamination processes as part of the method, in which the dielectric layers, having the designated circuitry and/or conductive elements (planes) thereon are "stacked up" in aligned manner with one another and subjected to relatively high pressures and temperatures associated with conventional lamination. Of perhaps greater significance, the invention, able to utilize thru-holes and other elements of very fine definition, is able to assure highly dense circuit patterns as are deemed extremely important with regards to many of today's design requirements.

While there have been shown and described what at present are considered the preferred embodiments of the invention, it will be obvious to those skilled in the art that various changes and modifications may be made therein without departing from the scope of the invention as defined by the appended claims.

What is claimed is:

1. A method of making a capacitive substrate, said method comprising:
    providing a conductive layer;
    providing a capacitive dielectric layer comprised of a mixture of a polymer material and a ferroelectric ceramic crystalline nanoparticle material, said capacitive dielectric layer having a thickness of from about 0.1 mils to about 5 mils and including first and second opposing sides;
    bonding said first opposing side of said capacitive dielectric layer to said conductive layer;
    curing said capacitive dielectric layer on said conductive layer at a temperature from about 150 degrees Celsius to about 200 degrees Celsius;
    forming at least one first conductor on said second opposing side of said capacitive dielectric layer after said curing of said capacitive dielectric layer;
    forming an electrical connection through said capacitive dielectric layer to said at least one first conductor; and
    forming at least one second conductor from said conductive layer, said at least one second conductor not being electrically connected to said at least one first conductor and said electrical connection through said capacitive dielectric layer, each of said at least one first and second conductors serving as capacitor electrodes when said conductors are electrically coupled to other circuit structure and said circuit structure is operational.

2. The method of claim 1 wherein said bonding of said capacitive dielectric layer to said conductive layer is accomplished using a process selected from the group of processes consisting of screen printing, ink-jet printing and coating.

3. The method of claim 2 wherein said curing of said material of said capacitive dielectric layer is accomplished in a time period of from about 100 minutes to about 140 minutes.

4. The method of claim 1 wherein said forming of said electrical connection through said capacitive dielectric layer comprises forming a hole within said capacitive dielectric layer and thereafter depositing electrically conductive material within said hole.

5. The method of claim 4 wherein said forming of said hole is accomplished by a drilling operation using a mechanical drill or a laser.

6. The method of claim 5 wherein said depositing of said electrically conductive material within said hole is accomplished using a plating operation.

7. The method of claim 1 wherein said forming of said at least one second conductor from said conductive layer is accomplished using photolithographic processing.

8. A method of making a capacitive substrate having first and second capacitors therein, said method comprising:
    providing first and second conductive layers;
    providing first and second capacitive dielectric layers each comprised of a mixture of a polymer material and a ferroelectric ceramic crystalline nanoparticle material, said first and second capacitive dielectric layers each having a thickness of from about 0.1 mils to about 5 mils and including first and second opposing sides;
    bonding said first opposing side of said first capacitive dielectric layer to said first conductive layer and said first opposing side of said second capacitive dielectric layer to said second conductive layer;
    curing said first and second capacitive dielectric layers on said first and second conductive layers respectively at a temperature from about 150 degrees Celsius to about 200 degrees Celsius;
    forming at least one first conductor on each of said second opposing sides of said first and second capacitive dielectric layers, respectively after said curing of said first and second capacitive dielectric layers;
    forming an electrical connection through each of said first and second capacitive dielectric layers to said at least one first conductor on each of said second opposing sides of said first and second capacitive dielectric layers, respectively; and
    forming at least one second conductor from each of said first and second conductive layers, respectively, each of said at least one second conductors not being electrically connected to the corresponding one of said at least one first conductors and said electrical connections through said capacitive dielectric layers, each of said at least one first and second conductors on said first and second capacitive dielectric layers serving as capacitor electrodes for a single capacitor when said conductors are electrically coupled to other circuit structure and said circuit structure is operational.

9. The method of claim 8 wherein said bonding of said capacitive dielectric layer to said conductive layer is accomplished using a process selected from the group of processes consisting of screen printing, ink-jet printing and coating, the material of said capacitive dielectric layer being substantially cured, said curing of said material of said capacitive dielectric layers being accomplished in a time period of from about 100 minutes to about 140 minutes.

10. The method of claim 8 wherein said forming of said electrical connections through said capacitive dielectric layers comprises forming a hole within each of said capacitive dielectric layers and thereafter depositing electrically conductive material within said holes.

11. The method of claim 10 wherein said forming of said holes is accomplished by a drilling operation using a mechanical drill or a laser.

12. The method of claim 11 wherein said depositing of said electrically conductive material within said holes is accomplished using a plating operation.

13. The method of claim 1 wherein said forming of said at least one second conductor from said conductive layers is accomplished using photolithographic processing.

14. A method of making a circuitized substrate having a capacitive substrate therein, said method comprising:
provarding a conductive layer;
providing a capacitive dielectric layer comprised of a mixture of a polymer material and a ferroelectric ceramic crystalline nanoparticle material, said capacitive dielectric layer having a thickness of from about 0.1 mils to about 5 mils and including first and second opposing sides;
bonding said first opposing side of said capacitive dielectric layer to said conductive layer;
curing said capacitive dielectric layer on said conductive layer at a temperature from about 150 degrees Celsius to about 200 degrees Celsius;
forming at least one first conductor on said second opposing side of said capacitive dielectric layer after said curing of said capacitive dielectric layer;
forming an electrical connection through said capacitive dielectric layer to said at least one first conductor;
forming at least one second conductor from said conductive layer, said at least one second conductor not being electrically connected to said at least one first conductor and said electrical connection through said capacitive dielectric layer;
forming a dielectric layer on said capacitive dielectric layer over said at least one second conductor and said electrical connection;
forming third and fourth conductors on said dielectric layer; and
electrically coupling said third conductor to said at least one first conductor and said fourth conductor to said electrical connection to form an electrical circuit including, at least one first and second conductors, said third and fourth conductors and said electrical connection, each of said at least one first and second conductors serving as capacitor electrodes of a capacitor within said electrical circuit when said electrical circuit is operational.

15. The method of claim 14 wherein said forming of said dielectric layer on said capacitive dielectric layer over said at least one second conductor and said electrical connection is accomplished using a lamination procedure.

16. The method of claim 14 wherein said forming of said third and fourth conductors on said dielectric layer is accomplished using photolithographic processing.

17. A method of making a circuitized substrate having a capacitive substrate therein including first and second capacitors, said method comprising:
providing first and second conductive layers;
providing first and second capacitive dielectric layers each comprised of a mixture of a polymer material and a ferroelectric ceramic crystalline nanoparticle material, said first and second capacitive dielectric layers each having a thickness of from about 0.1 mils to about 5 mils and including first and second opposing sides;
bonding said first opposing side of said first capacitive dielectric layer to said first conductive layer and said first opposing side of said second capacitive dielectric layer to said second conductive layer;
curing said first and second capacitive dielectric layers on said first and second conductive layers respectively at a temperature from about 150 degrees Celsius to about 200 degrees Celsius;
forming at least one first conductor on each of said second opposing sides of said first and second capacitive dielectric layers, respectively after said curing of said first and second capacitive dielectric layers;
forming first and second electrical connections through said first and second capacitive dielectric layers, respectively, to said at least one first conductor on each of said second opposing sides of said first and second capacitive dielectric layers, respectively;
forming at least one second conductor from each of said first and second conductive layers, respectively, each of said at least one second conductors not being electrically connected to the corresponding one of said at least one first conductors and said electrical connections through said capacitive dielectric layers;
forming a dielectric layer on each of said capacitive dielectric layers over each of said at least one second conductors and said electrical connections, respectively;
forming third and fourth conductors on one of said dielectric layers, and fifth and sixth conductors on a second of said dielectric layers, respectively;
electrically coupling said third conductor to one of said at least one first conductors and said fourth conductor to said first electrical connection to form a first electrical circuit including said at least one first and second conductors, said third and fourth conductors and said first electrical connection, each of said at least one first and second conductors serving as capacitor electrodes of a first capacitor within said electrical circuit when said first electrical circuit is operational; and
electrically coupling said fifth conductor to one of said at least one first conductors and said sixth conductor to said second electrical connection to form a second electrical circuit including said at least one first and second conductors, said fifth and sixth conductors and said second electrical connection, each of said at least one first and second conductors serving as capacitor electrodes of a second capacitor within said second electrical circuit when said second electrical circuit is operational.

18. The method of claim 17 wherein said forming of said dielectric layers on each of said capacitive dielectric layers over said at least one second conductor and said electrical connection is accomplished using a lamination procedure.

19. The method of claim 18 wherein said forming of said third and fourth conductors on one of said dielectric layers and said forming of said fifth and sixth conductors on the second of said dielectric layers is accomplished using photolithographic processing.

* * * * *